US012244135B2

(12) United States Patent
Donolo et al.

(10) Patent No.: US 12,244,135 B2
(45) Date of Patent: Mar. 4, 2025

(54) DIFFERENTIAL PROTECTION USING INSTRUMENT TRANSFORMER SIGNAL TRANSDUCERS

(71) Applicant: Schweitzer Engineering Laboratories, Inc., Pullman, WA (US)

(72) Inventors: Marcos A. Donolo, Pullman, WA (US); Jay Hartshorn, Pullman, WA (US); Anushka M. Dissanayake, Pullman, WA (US); Pallavi Kulkarni, Pullman, WA (US); Veselin Skendzic, Schwenksville, PA (US); Vinod K. Yedidi, King of Prussia, PA (US); Subhash C. Patel, West Chester, PA (US); Angelo D'Aversa, Ambler, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 248 days.

(21) Appl. No.: 18/056,087

(22) Filed: Nov. 16, 2022

(65) Prior Publication Data
US 2023/0170685 A1 Jun. 1, 2023

Related U.S. Application Data

(60) Provisional application No. 63/264,751, filed on Dec. 1, 2021.

(51) Int. Cl.
*H02H 7/00* (2006.01)
*G01R 15/18* (2006.01)
*H02H 7/045* (2006.01)

(52) U.S. Cl.
CPC ......... *H02H 7/0455* (2013.01); *G01R 15/181* (2013.01)

(58) Field of Classification Search
None
See application file for complete search history.

(56) References Cited

U.S. PATENT DOCUMENTS

| 4,387,336 A | 6/1983 | Joy |
| 4,419,589 A * | 12/1983 | Ross .......................... H02J 3/14 307/34 |

(Continued)

OTHER PUBLICATIONS

IEEE Power System Relaying and Control Committee: "IEEE Guide for the Applciation for Rogowski Coils Used for Protective Relaying Purposes" Nov. 9, 2021.

(Continued)

*Primary Examiner* — Stephen W Jackson
(74) *Attorney, Agent, or Firm* — Richard M. Edge

(57) ABSTRACT

Signal transducers in electrical communication with shorted leads of current transformers are used to provide monitoring and protection functions to an electric power delivery system. Differential protection is performed by comparing a predetermined threshold against a voltage signal from series-connected leads of signal transducers in electrical communication with shorted leads of current transformers. The signal transducers may be Rogowski coils. Signal transducers in communication with shorted leads may be used to improve safety and increase performance of the current transformers by decreasing susceptibility to saturation.

17 Claims, 7 Drawing Sheets

(56) References Cited

U.S. PATENT DOCUMENTS

| | | | |
|---|---|---|---|
| 4,566,053 A * | 1/1986 | Strickland, Jr. | H02H 3/105 361/42 |
| 4,829,298 A | 5/1989 | Fernandes | |
| 5,006,846 A | 4/1991 | Granville | |
| 5,224,011 A | 6/1993 | Yalla | |
| 5,341,265 A | 8/1994 | Westrom | |
| 5,446,682 A | 8/1995 | Janke | |
| 5,498,956 A | 3/1996 | Kinney | |
| 5,592,393 A | 1/1997 | Yalla | |
| 5,694,281 A | 12/1997 | Roberts | |
| 5,703,745 A | 12/1997 | Roberts | |
| 5,731,943 A | 3/1998 | Roberts | |
| 5,793,750 A | 8/1998 | Schweitzer | |
| 5,963,404 A | 10/1999 | Guzman | |
| 6,028,754 A | 2/2000 | Guzman | |
| 6,236,949 B1 | 5/2001 | Hart | |
| 6,256,592 B1 | 7/2001 | Roberts | |
| 6,265,881 B1 | 7/2001 | Meliopoulos | |
| 6,341,055 B1 | 1/2002 | Guzman | |
| 6,356,421 B1 | 3/2002 | Guzman | |
| 6,411,865 B1 | 6/2002 | Qin | |
| 6,442,010 B1 | 8/2002 | Kasztenny | |
| 6,446,682 B1 | 9/2002 | Viken | |
| 6,518,767 B1 | 2/2003 | Roberts | |
| 6,525,543 B1 | 2/2003 | Roberts | |
| 6,590,397 B2 | 7/2003 | Roberts | |
| 6,603,298 B2 | 8/2003 | Guzman | |
| 6,608,742 B2 | 8/2003 | Schweitzer | |
| 6,662,124 B2 | 12/2003 | Schweitzer | |
| 6,757,146 B2 | 6/2004 | Benmouyal | |
| 6,839,210 B2 | 1/2005 | Roberts | |
| 6,845,333 B2 | 1/2005 | Anderson | |
| 6,946,753 B2 | 9/2005 | Kernahan | |
| 7,002,784 B2 | 2/2006 | Wang | |
| 7,196,884 B2 | 3/2007 | Guzman | |
| 7,209,839 B2 | 4/2007 | Roytelman | |
| 7,319,576 B2 | 1/2008 | Thompson | |
| 7,480,580 B2 | 1/2009 | Zweigle | |
| 7,570,469 B2 | 8/2009 | Guzman | |
| 7,582,986 B2 | 9/2009 | Folkers | |
| 7,630,863 B2 | 12/2009 | Zweigle | |
| 7,660,088 B2 | 2/2010 | Benmouyal | |
| 7,710,693 B2 | 5/2010 | Guzman | |
| 7,856,327 B2 | 12/2010 | Schweitzer | |
| 8,405,944 B2 | 3/2013 | Donolo | |
| 2004/0027748 A1 | 2/2004 | Kojovic | |
| 2004/0059469 A1 | 3/2004 | Hart | |
| 2006/0224336 A1 | 10/2006 | Petras | |
| 2007/0086134 A1 | 4/2007 | Zweigle | |
| 2008/0281540 A1 | 11/2008 | Zweigle | |
| 2009/0085407 A1 | 4/2009 | Venkatasubramanian | |
| 2009/0088989 A1 | 4/2009 | Guzman | |
| 2009/0088990 A1 | 4/2009 | Schweitzer | |
| 2009/0089608 A1 | 4/2009 | Guzman | |
| 2009/0091867 A1 | 4/2009 | Guzman | |
| 2009/0099798 A1 | 4/2009 | Gong | |
| 2009/0125158 A1 | 5/2009 | Schweitzer | |
| 2010/0002348 A1 | 1/2010 | Donolo | |
| 2010/0114390 A1 | 5/2010 | Stevenson | |
| 2018/0005542 A1 * | 1/2018 | Ward | G01R 19/2513 |

OTHER PUBLICATIONS

Schweitzer Engineering Laboratories, Inc., SEL-849 Motor Management Relay Instruction Manual, Section 2 and Section 4, Feb. 2019.

Ariana Hargrave, Michael J. Thompson, and Brad Heilman, "Beyond the Knee Point: A Practical Guide to CT Saturation" Originally presented at the 44th Annual Western Protective Relay Conference, Oct. 2017.

Rick Turner and Stan Zocholl, "High Impedance Differential Protection Using Overcurrent Relays", SEL Application Guide, vol. V, AG98-09, Jun. 2001.

John Needs and Zafer Korkmaz, "Using the SEL-751 and SEL-751A for High-Impedance Differential Protection", SEL Application Guide, vol. IV, AG2017-03, Mar. 2017.

Stanley E. Zocholl and David Costello, "Application Guidelines for Microprocessor-Based, High-Impedance Bus Differential Relays," Originally presented at the 62nd Annual Conference for Protective Relay Engineers, Mar. 2009.

* cited by examiner

DIFFERENTIAL PROTECTION USING INSTRUMENT TRANSFORMER SIGNAL TRANSDUCERS

RELATED APPLICATIONS

This application claims the benefit under 35 U.S.C. § 19(e) to U.S. Provisional Application No. 63/264,751, filed 1 Dec. 2021, and entitled "Differential Protection Using Instrument Transformer Signal Transducers," which is incorporated herein by reference in its entirety for all purposes.

TECHNICAL FIELD

This disclosure relates to differential protection in an electric power system using instrument transformer signal transducers.

BRIEF DESCRIPTION OF THE DRAWINGS

Non-limiting and non-exhaustive embodiments of the disclosure are described, including various embodiments of the disclosure with reference to the figures, in which.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Reliable and secure electric power delivery system protection is facilitated by acquisition of current signals that reliably represent current of the monitored equipment. Current signals are often obtained using current transformers (CTs). Under overcurrent or fault conditions, CTs may become saturated and provide unreliable signals, thus hindering the capability of a protective device to provide reliable and secure protection.

Furthermore, in certain installations, the CTs on various phases and feeders must match for proper combination of current signals. CTs may further have requirements (e.g. class rating) to be sure that reliable signals are provided to the protection device.

Figure 1:
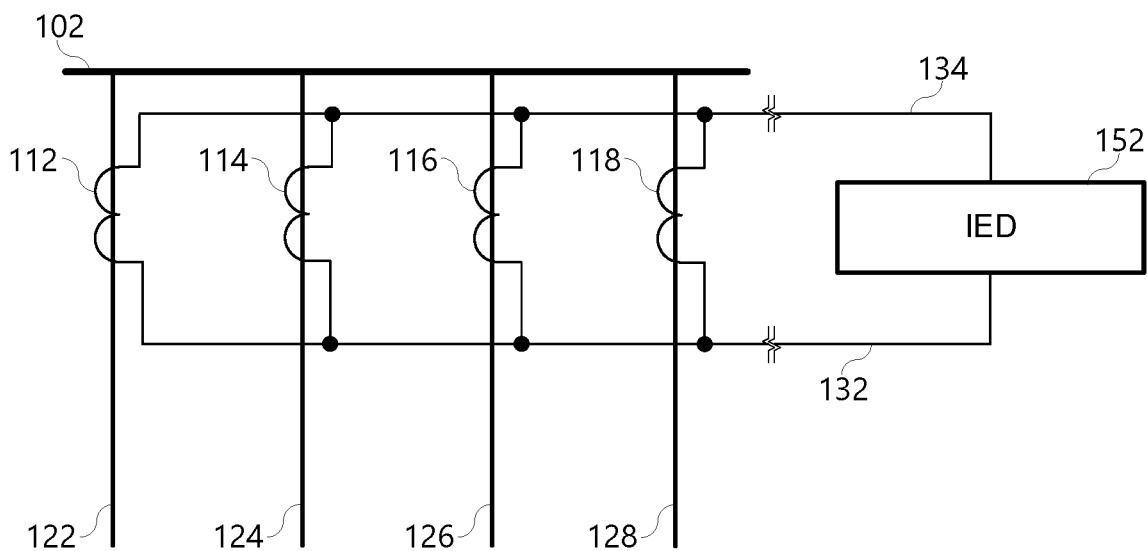
FIG. 1 illustrates a simplified one-line diagram of a portion of an electric power delivery system and associated protection system.

FIG. 1 illustrates a simplified one-line diagram of a portion of an electric power delivery system that includes a bus 102 and a plurality of feeders 122, 124, 126, 128. Each feeder 122-128 includes a CT 112, 114, 116, 118 for providing current signals to the intelligent electronic device (IED) 152. As can be seen, the secondary terminal leads 132, 134 from corresponding sides of each CT 112-118 may be joined together for providing a differential current signal to the IED 152. In various other embodiments, each CT 112-118 may be separately connected to the IED (not separately illustrated), such that the relay receives separate current signals from each CT.

Figure 2:
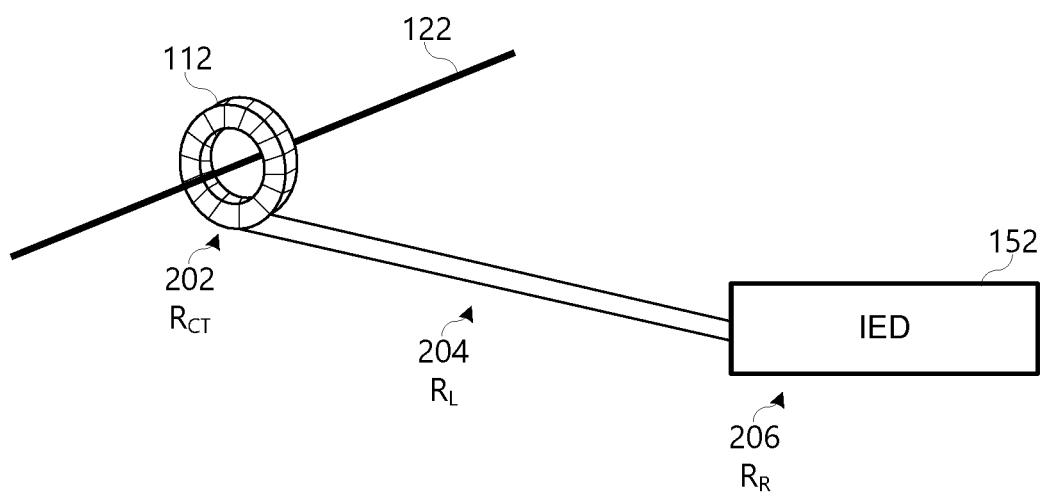
FIG. 2 illustrates a simplified diagram of a current transformer (CT) and related resistances.

FIG. 2 illustrates a simplified diagram of a CT 112 used to obtain a current signal from feeder 122. The burden of CT 112 is a function of the CT resistance $R_{CT}$ 202, the lead resistance $R_L$ 204 and the relay or meter resistance $R_R$ 206. In power system installations, the feeders and CTs may be situated in a switchyard or substation, with the IED being housed in a control house located some distance from the CTs. Accordingly, the leads from the CTs may be relatively long. Because the lead resistance $R_L$ 204 increases with the length of the leads, the CT burden also increases with longer leads.

Further, the leads from the CTs may be of different lengths. Accordingly, CT burden may be different for each CT of each feeder, even if the CTs are identical, due to the different lead resistances $R_L$ 204.

The CT burden must be considered when determining the appropriate CT for the system and conditions. A higher burden (e.g. lead resistance $R_L$) will require a CT with a higher primary current rating (or higher class rating). Increasing burden of a CT will result in higher likelihood of saturation (and lower accuracy of the secondary signal delivered to the IED). Accordingly, what is needed are systems and methods to decrease CT burden so that accurate signals may be delivered to the IED even when the IED may be located remote from the CT.

Furthermore, for accurate protection and monitoring, signals delivered from different feeders should be balanced, regardless of the distance between the CT and the IED. Given the requirement that the CTs be balanced, different lead lengths may increase the complexity of the system design. In many installations, identical (or identically rated) CTs may be used on each conductor. Accordingly, because each CT may experience a different burden, the CTs will not saturate equally under external fault conditions. This may result in unreliable current signals to the IED for protection purposes. To maintain simplicity of system design, what is needed are systems and methods to increase CT balance regardless of the varying distances between the CTs and the IED.

Provided herein are systems and methods to decrease CT burden, resulting in more accurate CT signals for protection and monitoring purposes. Furthermore, provided herein are systems and methods to improve CT balance regardless of variation in lead lengths from the CTs to the IED. Further herein are systems and methods of differential protection using signal transducers to obtain signals from instrument transformers.

As disclosed in several embodiments herein, each CT is shorted at or near the monitored equipment, and a signal transducer is used on the shorted CT to provide to the protective device (the IED) a signal related to the current in the primary equipment. In accordance with several embodiments, the signal transducer may be a Rogowski coil.

Figure 3:
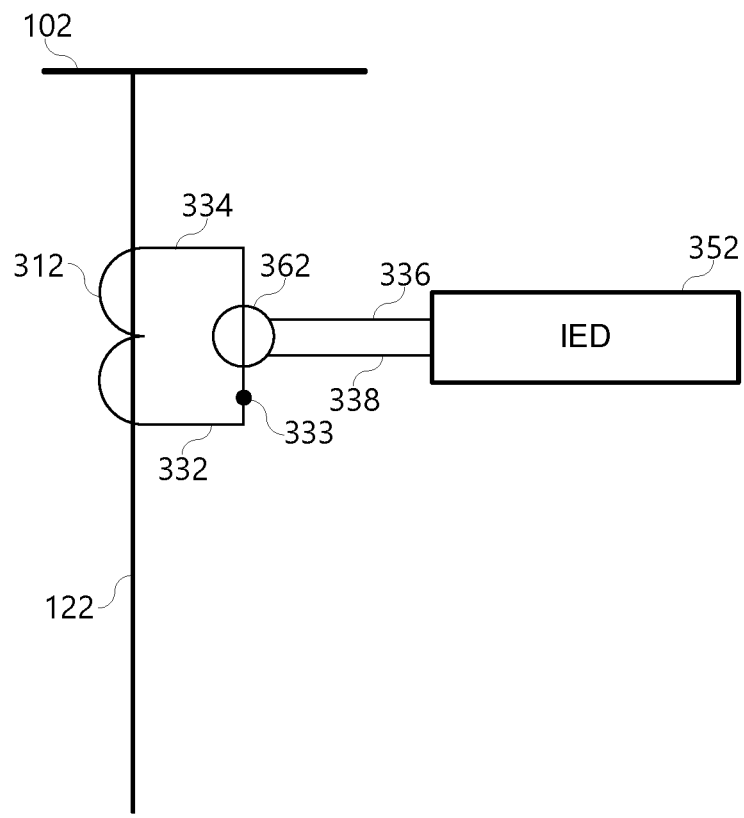
FIG. 3 illustrates a simplified one-line diagram of a portion of an electric power delivery system and associated protection system using instrument transformer signal transducers in accordance with several embodiments.

FIG. 3 illustrates a simplified diagram of an electric power system for providing signals to an IED in accordance with several embodiments herein. In particular, CT 312 may be used to obtain signals from conductor 122. The CT 312 includes an electrically-continuous secondary winding that is in electrical communication with a signal transducer 362. The signal transducer 362 is used to provide signals to an IED for protection. As is illustrated, leads 332, 334 of the secondary winding of the CT are shorted together at node 333. The short 333 may be at the terminals of the CT, in the protection zone of the IED. With the leads 332, 334 shorted together, the lead resistance $R_L$ is kept to a minimum. Furthermore, in a system with several CTs having their leads shorted together, the lead resistances $R_L$ of each of the CTs may be substantially similar, facilitating balance among the plurality of CTs.

The signal transducer 362 may be used to obtain electrical signals from the CT 312. In various embodiments, the signal transducer 362 may be a Rogowski coil mounted around the shorted leads 332, 334 of the CT 312. The signal transducer 362 may provide a signal to an IED 352 that is related to the current signal obtained by the CT 312. The signal transducer may provide the signal using leads 336, 338. In various embodiments, the signals may be provided to a merging unit or other intervening device before being provided to an IED. In various embodiments, the signals from the signal transducer 362 may be used to determine currents through the conductor 122 for monitoring and protection functions. As is described in further detail below, the signals provided by a Rogowski coil may be a voltage that is related to the derivative of current through the leads 334, 332 of the CT. The IED may integrate the voltage signal to determine the secondary current from the CT.

Figure 4:
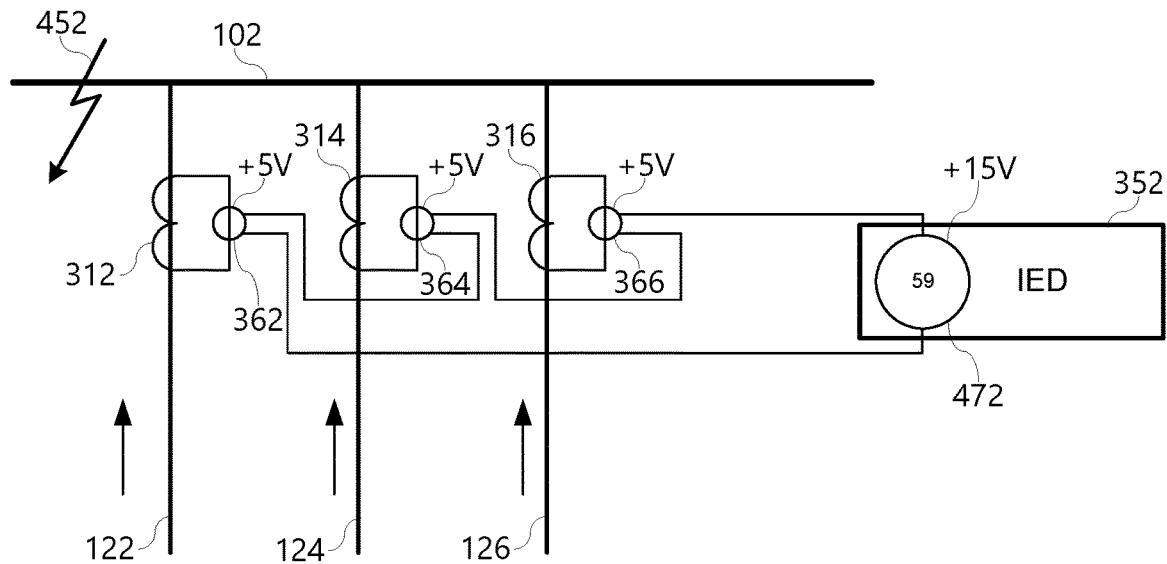
FIG. 4 illustrates a simplified one-line diagram electric power system protection system using instrument transformer signal transducers during an internal fault in accordance with several embodiments.
Figure 5:
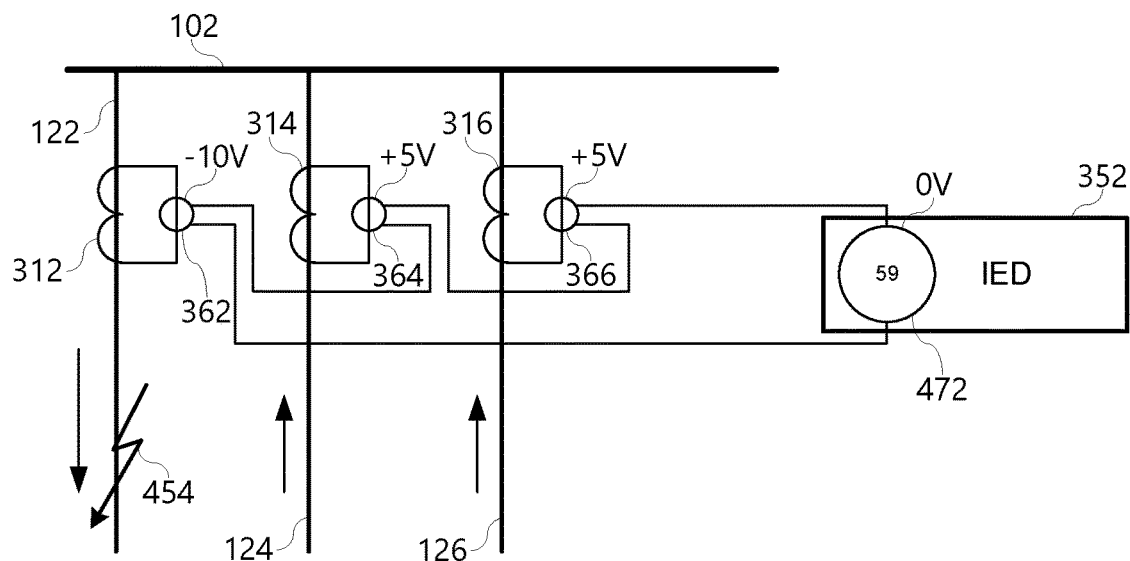
FIG. 5 illustrates a simplified one-line diagram electric power system protection system using instrument transformer signal transducers during an external fault in accordance with several embodiments.

FIGS. 4 and 5 illustrate one-line diagrams of systems for protecting an electric power delivery system in accordance with several embodiments herein. In particular, differential protection is illustrated using signals from series-connected signal transducers that are each in electrical communication with instrument transformers on different portions of the electric power delivery system. The total current into and out of the protected system is represented by a signal obtained from the series-connected signal transformers. Under nominal operating conditions without an internal fault, the voltage signal provided by the series-connected signal transducers should be substantially zero. Accordingly, a differential fault may be determined when the voltage from the series-connected signal transducers exceeds a predetermined threshold.

As illustrated in FIGS. 4 and 5, the analog outputs of the signal transducers 362, 364, 366 of the CTs 312, 314, 316 may be connected in series with each other and terminated at the IED 352. The IED 352 may use the signal from the series connected signal transducers in an overvoltage element 472. As will be described below, the voltage signal from the signal transducers 362, 364, 366 as illustrated may be used for current differential protection on the system of feeders. In one embodiment, the signal transducers 362, 364, 366 may be Rogowski coils where the Rogowski Coil and CT pairs have the same primary current to voltage ratio which allows for different primary CT ratios on different feeders. The Rogowski coils produce a voltage proportional to the derivative of the current. These derivatives add up to zero for normal operating conditions. Internal faults may be detected by the overvoltage element 472.

FIG. 4 illustrates a power system with a fault 452 on bus 102, which is an internal fault. As illustrated, the fault 452 on bus 102 would result in current from each of the feeders 122, 124, 126 flowing in the same direction to the fault 452 to feed the fault. As illustrated, the voltage signals provide by each of the signal transducers 362, 364, 366 is +5V. With the signal transducers 362, 364, 366 wired in series to the IED 352, the voltage detected at the IED is the sum of the voltages at each signal transducer 362, 364, 366. Accordingly, the overvoltage element 472 receives a voltage signal of +15V. The overvoltage element 472 may compare the received +15V voltage signal against a predetermined threshold. The predetermined threshold may be set relatively low because under normal operating conditions, the sum of the voltages from the signal transducers 362, 364, 366 should be zero or close to zero. Because the detected voltage exceeds the predetermined threshold, the differential current fault 452 may be detected, and a protective action may be taken.

FIG. 5 illustrates the system of FIG. 4, under an external fault 454 on feeder 122. Under these conditions, a current differential protection element should not take a protective action. The illustrated fault 454 may be fed by the unfaulted feeders, resulting in a sum of the voltages from the signal transducers 362, 364, 366 being zero or substantially zero. As illustrated, the voltage from the signal transducer 362 associated with the feeder 122 experiencing the fault 454 is −10V, whereas the voltages from the signal transducers 364, 366 associated with the feeders 124, 126 are each +5V. With the signal transducers 362, 364, 366 wired in series, the voltage measured by the overvoltage element 472 of the IED 352 is zero or substantially zero. The overvoltage element 472 may compare the measured voltage against the predetermined threshold. Because the voltage does not exceed the predetermined threshold, no protective action is taken by the current differential protection module for the external fault 454.

Note that the currents in the illustrated embodiments do not need to be synchronized as carefully as in a current percentage differential scheme because the differential current equivalent is done by adding the voltages from the signal transducers directly. This allows for handling of multiple feeders with modest additional hardware.

Accordingly, in various embodiments, systems and methods are disclosed herein for modifying an electric power delivery system to improve differential protection and individual feeder protection. The systems and methods include shorting the secondary leads of CTs on each feeder; mounting a signal transducer on the shorted secondaries of the CTs; and providing signals from the signal transducer to an IED for providing monitoring and protection of the power system.

Figure 6:
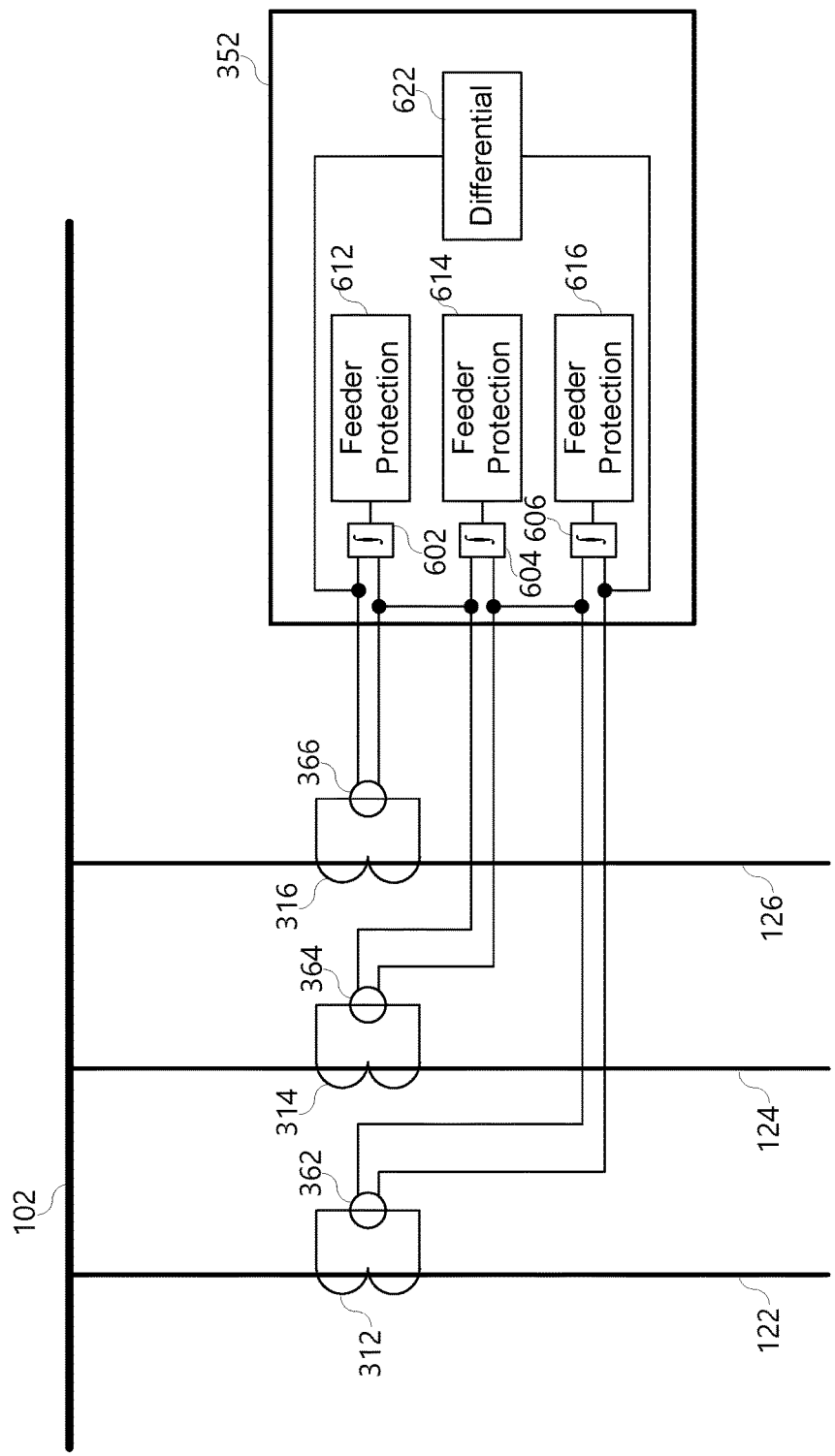
FIG. 6 illustrates a simplified one-line diagram of a portion of an electric power delivery system and associated protection system using instrument transformer signal transducers in accordance with several embodiments.

While all the voltages can be daisy chained in the yard, bringing all the voltages to centralized location allows for additional individual feeder current measurements for other current protection. FIG. 6 illustrates a simplified block diagram of a system using the voltages from the signal transducers for obtaining additional feeder current measurements and performing various monitoring and protection functions. As has been described, current differential protection may be performed using a differential module 622 of an IED. The sum of the voltage signals from the various signal transducers 362, 364, 366 may be used by an overvoltage element to determine an internal fault. As illustrated, the overvoltage element is implemented in the differential module 622.

Differential protection can be restrained using the through currents in embodiments where individual feeder current measurements are obtained. For example, the individual feeder current measurements may be used to adjust or calculate a threshold used in the differential module for comparing against the signal from the series-connected signal transducers.

Furthermore, the voltage signals provided by the signal transducers 362, 364, 366 may be used by various other monitoring and protection functions of the IED 352. In various embodiments, the signal transducers 362, 364, 366 may be implemented as Rogowski coils, which provide a voltage signal that corresponds with a derivative of the current through the secondaries of the current transformers 312, 314, 316. Accordingly, the IED may include integrators (either analog or digital) 602, 604, 606 to integrate the voltage signals associated with the feeders. The integral of the voltage signals is related to the current through the CTs. With knowledge of the CT ratios, the signals provided by the signal transducers 362, 364, 366 may be used to determine current through the feeders 122, 124, 126. Various feeder protection modules 612, 614, 616 may be used to apply protection and monitoring functions for the feeders 122, 124, 126. Voltage measurements may be obtained using a potential transformer on the bus (as illustrated and described in conjunction with FIG. 8) and used for feeder protection. Feeder protection may include, for example, overcurrent, time overcurrent, underfrequency, distance protection, directional overcurrent, power factor, loss of potential, and the like.

As has been noted above, shorting the CTs at their terminals reduces the CT burden to a minimum and allows for higher primary current before CT saturation. For small CTs with low internal secondary winding resistance installed on large substations with relatively thin secondary leads, the saturation threshold may move by 5 times or more. For example, a CT with 150 mΩ secondary winding resistance connected with 13-gauge wire to a relay 150 ft away (~50 m) would see the symmetrical saturation current improved by 4 times.

Figure 7:
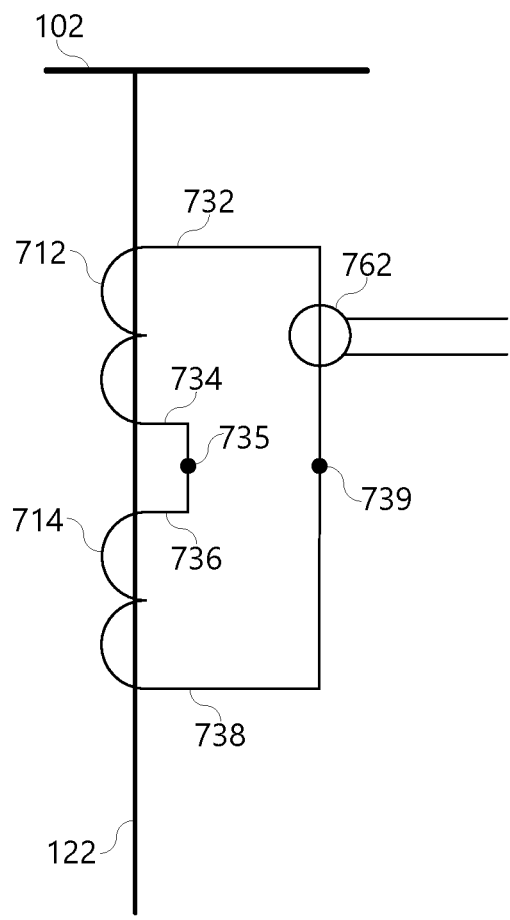
FIG. 7 illustrates a simplified one-line diagram of a system for obtaining electric signals from an instrument transformer using a signal transducer in accordance with several embodiments.

In various existing high-impedance bus differential schemes, two or more CTs are used on each feeder. This is because one CT per feeder is used for the high-impedance bus differential and another CT per feeder may be used to obtain current signals for individual feeder protection. The two or more CTs may be used in accordance with several embodiments herein to improve CT accuracy. As illustrated in FIG. 7, the two CTs 712, 714 may be connected in series by connecting first leads 734, 736 at a first point 735 and shorting the other leads 732, 738 at shorting point 739. As previously described, a signal transducer 762 may be mounted on the shorted leads. The signal transducer 762 may be used to provide a voltage signal relative to the current through the shorted secondary of the series-connected CTs 712, 714. Connecting two CTs in series as illustrated provides a higher current in the series-connected leads than would be available using either of single CTs.

The voltage signal provided using signal transducer 762 may be used as illustrated in FIG. 6 for both current differential protection and for individual feeder protection. Accordingly, in various embodiments, systems and methods are disclosed herein for modifying an electric power delivery system to improve differential protection and individual feeder protection are provided herein. The systems and methods include connecting two or more existing CTs on each feeder in series; mounting a signal transducer on the secondaries of the series-connected CTs; and providing signals from the signal transducer to an IED for providing monitoring and protection of the power system.

Shorting the CTs at their terminal in accordance with the illustrated embodiments will eliminate saturation in many installations. Elimination of saturation will improve the signal provided by the CTs. For those installations, the minimum fault current to be detected can be used to set the overvoltage element of the current differential module. The overvoltage element setting should be set as the minimum of the secondary fault current multiplied by the Rogowski coil amp to voltage ratio.

In installations where saturation is not avoidable, the predetermined setting for the overvoltage element of the differential module should be determined considering the expected saturation at the maximum through-fault current.

Noise in Rogowski coil secondary leads should be kept to a minimum to maintain an adequate signal to noise ratio (SNR) provided to the IED. Installations where the signal transducer used is a Rogowski coil may use shielding and other techniques to minimize noise. Additionally, we can improve the signal part of the SNR by selecting Rogowski coils with higher secondary voltages for the same current and/or by passing the CTs secondary current through the Rogowski coil.

The embodiments disclosed herein may improve safety over existing high-impedance bus differential protection installations. Traditional high-impedance differential schemes generate potentially dangerous voltages from the CT leads, which are not present in the embodiments presented herein.

Figure 8:
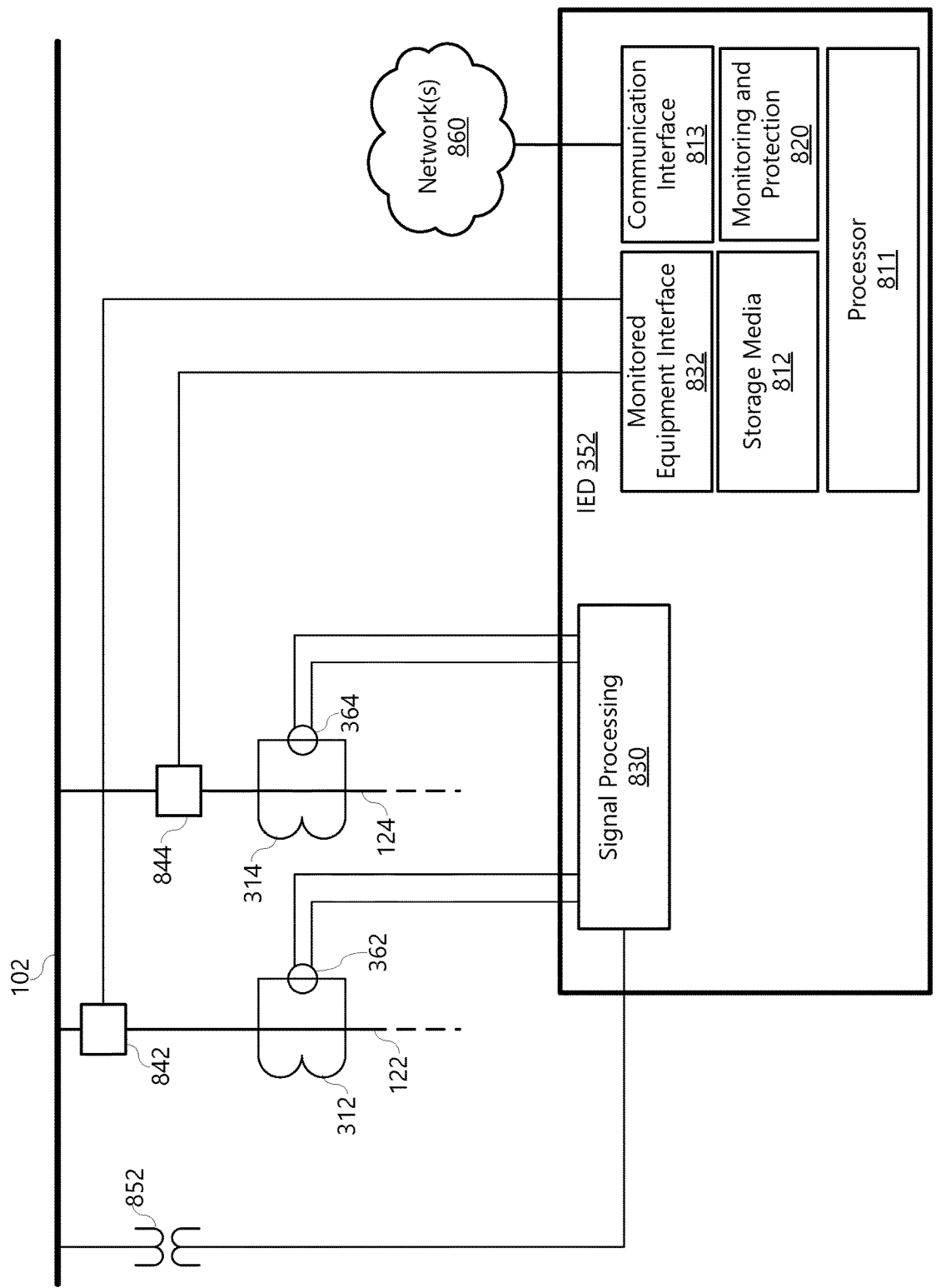
FIG. 8 illustrates a simplified diagram of an intelligent electronic device (IED) for protection of a power system using signals from signal transducers of instrument transformers in accordance with several embodiments.

FIG. 8 illustrates a one-line diagram of an electric power delivery system and a simplified block diagram of a system for current differential protection using signal transducers in accordance with various embodiments described herein. The electric power delivery system may be monitored by IED 352 that provides electric power system monitoring and protection. The IED 352 may provide protective actions, such as opening one or more circuit breakers 842, 844 upon detection of a fault (e.g. using differential, overcurrent, distance, directional or other protection elements). IED 352 may comprise and/or be implemented in conjunction with a computing device. IED 352 may include a processor 811, which may comprise one or more general purpose processors, special purposes processors, ASICs, programmable logic elements (e.g., FPGAs), or the like. The IED 352 may further comprise non-transitory machine-readable storage media 812, which may include one or more disks, solid-state storage (e.g., Flash memory), optical media, or the like. The IED 352 may be communicatively coupled to one or more networks 860 via one or more communication interfaces 813. The networks 860 may include special-purpose networks for monitoring and/or controlling the electrical power system (e.g., SCADA networks, or the like). The networks 860 may further include general purpose communication networks, such as a TCP/IP network, or the like. The communication interface 813 may include wired and/or wireless communication interfaces (e.g., serial ports, RJ-45, IEEE 802.11 wireless network transceivers, etc.). In some embodiments, the IED 352 may include human-machine interface (HMI) components (not shown), such as a display, input devices, and so on.

The IED 352 may include monitoring and/or protection functions in a monitoring and protection module 820 that may be embodied as instructions stored on computer-readable media (such as storage media 812) that, when executed on the processor 111, cause the IED to perform monitoring and protection operations. The protection operations may include, for example, differential, overvoltage, overcurrent, directional, distance, underfrequency, and other protection operations using signals provided by the signal processing 830.

The signal processing 830 may include filtering, delays, and the like to filter out distortions and transients with frequencies different than the fundamental frequency of the power system. The signal processing 830 may process electrical power system signals in accordance with the several embodiments herein for use by the monitoring and protection operations of the IED 352. The signal processing 352 may be implemented in hardware, software (firmware), or a combination. For example, the signal processing 830 may include analog-to-digital (A/D) converters to sample the analog stimulus and provide digitized analogs. The signal processing 830 may include circuitry and/or computer instructions for execution by the processor 811 to filter the digitized analogs and provide filtered samples for monitoring and protection operations in accordance with the various embodiments described herein.

The IED 352 may be communicatively coupled to the power system through current transformers, voltage transformers, and/or as is described herein, via signal transducers that obtain signals from instrument transformers. The stimulus may be received directly via the measurement devices described above and/or indirectly via the communication interface 813 (e.g., from another IED or other monitoring device (not shown) in the electrical power system). The stimulus may include, but is not limited to: signals related to current, signals related to voltage, and the like.

In various embodiments, the monitoring and protection 820 may include a current differential protection module to determine a fault within the protection zone using differential techniques. As described herein, the differential technique may include comparing a voltage from series-connected signal transducers against a predetermined threshold. Accordingly, the signals from the signal transducers 362, 364 (and others if included in the system) may be connected in series, with the signal therefrom being provided to the monitoring and protection module via the signal processing. The differential module may then compare the voltage of the series-connected signal transducers against the predetermined threshold to determine whether an internal fault is present. If an internal fault is detected, the differential module may signal the monitored equipment interface 832 to open a circuit breaker.

Furthermore, the IED 352 may include a monitored equipment interface 832 in electrical communication with a piece of monitored equipment. As illustrated, the monitored equipment interface 832 is in communication with the one or more circuit breakers 842, 844. The monitored equipment interface 832 may include hardware for providing a signal to one or more of the circuit breakers 842, 844 to open and/or close in response to a command from the IED 352. For example, upon detection of a fault, the IED 352 may signal the monitored equipment interface 832 to provide an open signal to the appropriate circuit breaker 842, 844, thus effecting a protective action on the electric power delivery system. In certain embodiments, the protective action may be effected by additional or separate devices. For example, upon determination of the fault, the IED 352 may signal other devices (using, for example, the network 860, or signaling another device directly) regarding the fault, which other devices may signal a breaker to open, this effecting the protective action on the electric power delivery system.

In various embodiments, individual feeders 122, 124 may be protected using signals obtained from the individual feeders and/or from the bus 102. The signal may be provided by instrument transformers (e.g. potential transformer 852) and/or via signal transducers (e.g. 362, 364) in electrical communication with instrument transformers (e.g. 312, 314), as described herein. Signal processing 830 may receive and condition these signals for use by the monitoring and protection module 820, which uses the conditioned signals to provide monitoring and protection functions. Upon detection of a fault, the monitoring and protection module 820 may signal the monitored equipment interface to operate the appropriate circuit breaker to open and clear the fault from the electric power delivery system. For example, the monitoring and protection module 820 may provide distance protection for the feeders 122, 124 using the voltage signal obtained via potential transformer 852 and the currents determined using signals from signal transducers 362, 364. Upon determining a fault within a zone of protection on feeder 122, for example, the IED may signal circuit breaker 842 to open, using the monitored equipment interface 832, to interrupt electric power supply to the fault by the electric power delivery system.

Accordingly, presented herein are systems and methods for electric power delivery system protection and monitoring using signals from signal transducers in electrical communication with instrument transformers. Furthermore, presented herein are systems and methods for differential protection using an overvoltage element operating on signals from series-connected signal transducers in electrical communication with instrument transformers of an electric power delivery system. The systems and methods herein may be used to increase safety by maintain leads from current transformers in the switchyard, and not in the control enclosure. The systems and methods herein may be used to increase current transformer accuracy by reducing burden; allowing for a higher range of current in the primary before saturation of the current transformer. The systems and methods herein may be used to balance current transformers by reducing or even eliminating the burden contributed by lead resistance.

While specific embodiments and applications of the disclosure have been illustrated and described, it is to be understood that the disclosure is not limited to the precise configurations and components disclosed herein. Moreover, principles described herein may also be utilized for distance protection and overcurrent protection. Accordingly, many changes may be made to the details of the above-described embodiments without departing from the underlying principles of this disclosure. The scope of the present invention should, therefore, be determined only by the following claims.

What is claimed:

1. A system to provide protection for an electric power delivery system, comprising:
   a first current transformer in electrical communication with a first portion of the electric power delivery system, the first current transformer comprising an electrically continuous secondary winding;
   a second current transformer in electrical communication with a second portion of the electric power delivery system, the second current transformer comprising an electrically continuous secondary winding;

a first Rogowski coil in electrical communication with the electrically continuous secondary winding of the first current transformer, and comprising a first signal transducer output;

a second Rogowski coil in electrical communication with the electrically continuous secondary winding of the second current transformer, and comprising a second signal transducer output;

a protective device in electrical communication with the first and second signal transducer outputs, the protective device comprising:

a protection module for determining a fault on the electric power delivery system using signals provided by the first signal transducer output and the second signal transducer output; and a monitored equipment interface to affect a protective action on the electric power delivery system upon determination of the fault.

2. The system of claim 1, wherein the first portion of the electric power delivery system comprises a first feeder in electrical connection with a bus, and the second portion of the electric power delivery system comprises a second feeder in electrical connection with the bus.

3. The system of claim 1, wherein the protection module comprises a differential protection module.

4. The system of claim 3, wherein the differential protection module comprises an overvoltage protection module configured to compare a voltage signal from the signals provided by the first Rogowski coil and the second Rogowski coil against a predetermined threshold.

5. The system of claim 4, wherein the first signal transducer output and the second signal transducer output are connected in series, and the overvoltage protection module compares the series-connected first and second signal transducer outputs against a predetermined threshold.

6. The system of claim 4, wherein the protective device affects a protective action on the electric power delivery system when the voltage signal exceeds the predetermined threshold.

7. The system of claim 1, wherein the first and second signal transducer outputs comprise voltage signals corresponding with a derivative of current.

8. The system of claim 1, wherein the electrically continuous secondary windings comprise shorted current transformer secondary leads.

9. The system of claim 1, wherein the protective device further comprises an integrator in communication with the first signal transducer output configured to integrate a signal from the first Rogowski coil to provide a signal corresponding with a current of the first portion of the electric power delivery system.

10. The system of claim 9, wherein the protection module comprises a feeder protection module for determining a condition of the first feeder using the signal corresponding with the current of the first portion of the electric power delivery system determined using the signal from the first Rogowski coil.

11. A method to provide protection for an electric power delivery system, comprising:

electrically connecting secondary winding leads of a first current transformer in electrical communication with a first portion of the electric power delivery system to form a first electrically continuous secondary winding;

electrically connecting secondary winding leads of a second current transformer in electrical communication with a second portion of the electric power delivery system to form a second electrically continuous secondary winding;

obtaining a voltage signal corresponding with current in the first and second electrically continuous secondary windings using series-connected signal transducers in electrical communication with the first and second electrically continuous secondary windings;

comparing the voltage signal against a predetermined threshold;

integrating a voltage signal from one series-connected signal transducer to produce a signal corresponding with a current in the first portion of the electric power delivery system;

determining a fault condition of the first conductor using the signal corresponding with the current in the first portion; and affect a protective action on the electric power delivery system when one or more of the following: the voltage signal exceeds the predetermined threshold; and a fault condition is determined.

12. The method of claim 11, wherein the series-connected signal transducers comprise Rogowski coils.

13. The method of claim 11, further comprising calculating the predetermined threshold using the integrated voltage signal.

14. The method of claim 11, further comprising electrically connecting the secondary winding leads at the terminals of the secondary winding leads.

15. The method of claim 11, further comprising electrically connecting the secondary winding leads outside of a control house.

16. A system to provide protection for an electric power delivery system, comprising:

a first current transformer in electrical communication with a first portion of the electric power delivery system, the first current transformer comprising shorted leads to form a first electrically continuous secondary winding;

a second current transformer in electrical communication with a second portion of the electric power delivery system, the second current transformer comprising shorted leads to form a second electrically continuous secondary winding;

a first signal transducer in electrical communication with the electrically continuous secondary winding of the first current transformer, and comprising a first signal transducer output;

a second signal transducer in electrical communication with the electrically continuous secondary winding of the second current transformer, and comprising a second signal transducer output;

a protective device in electrical communication with the first and second signal transducer outputs, the protective device comprising:

a protection module for determining a fault on the electric power delivery system using signals provided by the first signal transducer output and the second signal transducer output; and a monitored equipment interface to affect a protective action on the electric power delivery system upon determination of the fault.

17. A system to provide protection for an electric power delivery system, comprising:

a first current transformer in electrical communication with a first portion of the electric power delivery system, the first current transformer comprising an electrically continuous secondary winding;

a second current transformer in electrical communication with a second portion of the electric power delivery system, the second current transformer comprising an electrically continuous secondary winding;

a first signal transducer in electrical communication with the electrically continuous secondary winding of the first current transformer, and comprising a first signal transducer output;

a second signal transducer in electrical communication with the electrically continuous secondary winding of the second current transformer, and comprising a second signal transducer output;

a protective device in electrical communication with the first and second signal transducer outputs, the protective device comprising:

a differential protection module for determining a fault on the electric power delivery system, configured to compare a voltage signal from the signals provided by the first signal transducer output and the second signal transducer output against a predetermined threshold using an overvoltage protection module; and a monitored equipment interface to affect a protective action on the electric power delivery system upon determination of the fault.

* * * * *